US011227645B2

(12) United States Patent
Sakhare et al.

(10) Patent No.: US 11,227,645 B2
(45) Date of Patent: Jan. 18, 2022

(54) SPIN-TORQUE TRANSFER SWITCHABLE MAGNETIC TUNNEL JUNCTION UNIT AND A MEMORY DEVICE

(71) Applicants: IMEC VZW, Leuven (BE); VRIJE UNIVERSITEIT BRUSSEL, Brussels (BE)

(72) Inventors: Sushil Sakhare, Heverlee (BE); Manu Komalan Perumkunnil, Leuven (BE); Johan Swerts, Kessel-Lo (BE); Gouri Sankar Kar, Leuven (BE); Trong Huynh Bao, Leuven (BE)

(73) Assignee: IMEC VZW, Leuven (BE)

( * ) Notice: Subject to any disclaimer, the term of this patent is extended or adjusted under 35 U.S.C. 154(b) by 90 days.

(21) Appl. No.: 16/705,937

(22) Filed: Dec. 6, 2019

(65) Prior Publication Data

US 2020/0185016 A1    Jun. 11, 2020

(30) Foreign Application Priority Data

Dec. 6, 2018  (EP) .................................... 18210784

(51) Int. Cl.
*G11C 11/16*      (2006.01)
*H01L 27/22*      (2006.01)
(Continued)

(52) U.S. Cl.
CPC .......... *G11C 11/161* (2013.01); *H01L 27/222* (2013.01); *H01L 43/02* (2013.01); *H01L 43/08* (2013.01); *H01L 43/10* (2013.01)

(58) Field of Classification Search
CPC ............. G11C 11/161; G11C 11/1659; G11C 11/5607; G11C 11/1675; H01L 27/222; H01L 43/02; H01L 43/08; H01L 43/10
(Continued)

(56) References Cited

U.S. PATENT DOCUMENTS

2005/0045913  A1*   3/2005  Nguyen .............. G11C 11/5607
                                                               257/200
2011/0273926  A1   11/2011  Wu et al.
(Continued)

FOREIGN PATENT DOCUMENTS

WO    2005/020242 A2    3/2005
WO    2005/020242 A3    3/2005
(Continued)

OTHER PUBLICATIONS

European Search Report, European Patent Application No. 18210784. 7, dated Aug. 30, 2019, 16 pages.

*Primary Examiner* — Duy T Nguyen
(74) *Attorney, Agent, or Firm* — McDonnell Boehnen Hulbert & Berghoff LLP

(57) ABSTRACT

According to an example embodiment an MTJ unit is provided. The MTJ unit includes: a first MTJ comprising a first free layer, a first tunnel barrier layer and a first reference layer. The first MTJ is switchable between a parallel state and an anti-parallel state through spin-torque transfer (STT). The MTJ unit comprises a second MTJ arranged above the first MTJ and comprising, a second reference layer, a second tunnel barrier layer and a second free layer. The second MTJ is switchable between a parallel state and an anti-parallel state through STT. The MTJ unit comprises a pinning layer arranged between the first reference layer and the second reference layer and configured to fix a magnetization direction of the first reference layer and the second reference layer.

17 Claims, 6 Drawing Sheets

(51) Int. Cl.
*H01L 43/02* (2006.01)
*H01L 43/08* (2006.01)
*H01L 43/10* (2006.01)

(58) Field of Classification Search
USPC .......................................................... 257/421
See application file for complete search history.

(56) References Cited

U.S. PATENT DOCUMENTS

| | | |
|---|---|---|
| 2013/0037893 A1 | 2/2013 | Lee |
| 2013/0155764 A1 | 6/2013 | Noshiro |
| 2014/0050019 A1* | 2/2014 | Lee .................. G11C 11/16 |
| | | 365/158 |
| 2014/0103470 A1 | 4/2014 | Shukh |
| 2016/0055894 A1 | 2/2016 | Houssameddine et al. |
| 2016/0276407 A1 | 9/2016 | Naik et al. |
| 2017/0110653 A1* | 4/2017 | Seo .................. H01L 27/228 |
| 2017/0256584 A1* | 9/2017 | Sanuki .................. H01L 43/02 |
| 2017/0352701 A1* | 12/2017 | Gan .................. H01L 43/02 |

FOREIGN PATENT DOCUMENTS

| | | |
|---|---|---|
| WO | 2016/122402 A1 | 8/2016 |
| WO | 2018/159624 A1 | 9/2018 |

* cited by examiner

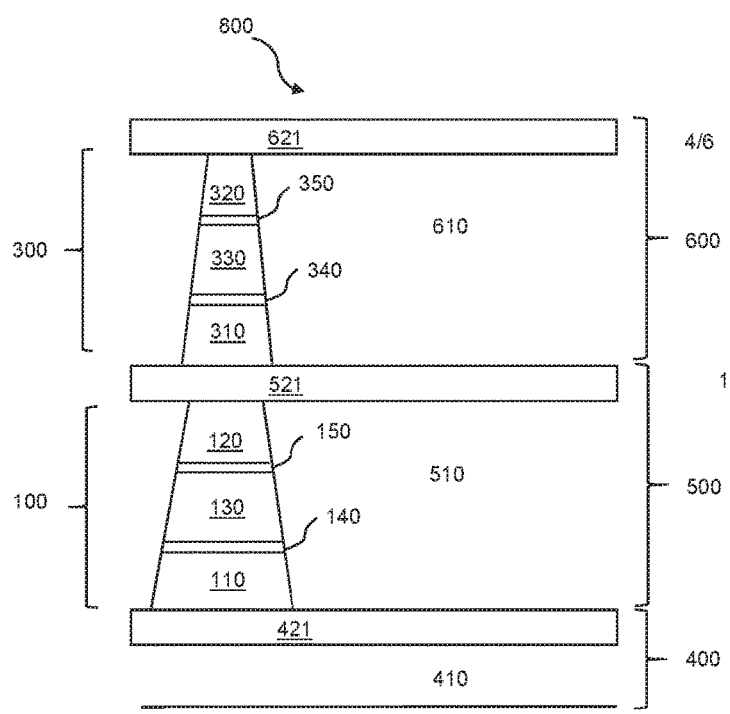
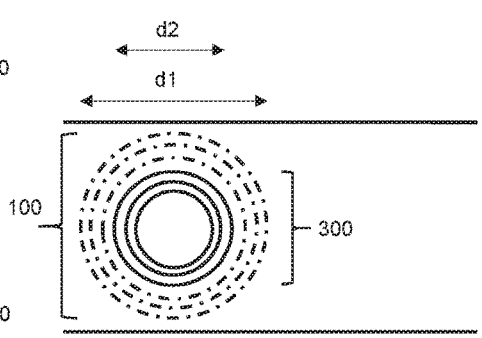
Fig. 5a
Fig. 5b

SPIN-TORQUE TRANSFER SWITCHABLE MAGNETIC TUNNEL JUNCTION UNIT AND A MEMORY DEVICE

CROSS-REFERENCE TO RELATED APPLICATIONS

The present application is a non-provisional patent application claiming priority to European Patent Application No. EP 18210784.7, filed Dec. 6, 2018, the contents of which are hereby incorporated by reference.

FIELD OF THE DISCLOSURE

The present disclosure relates to a magnetic tunnel junction unit. The present disclosure further relates to a memory device.

BACKGROUND

Magnetoresistive random access memory (MRAM) technology is a promising candidate for future memory technology. A magnetoresistive device or storage element may include a vertical magnetic tunnel junction structure (MTJ). An MTJ may comprise a free layer, a reference layer and a tunnel barrier layer arranged between the free layer and the reference layer. The reference layer and the free layer are typically ferromagnetic layers formed to present a perpendicular magnetic anisotropy (PMA) or an in-plane magnetic anisotropy. The magnetization direction of the reference layer is "fixed" or "pinned". The pinning of the reference layer may be achieved by a hard magnetic "pinning" layer arranged above the reference layer. Meanwhile, the magnetization direction of the free layer is switchable. The magnetization direction may be switched through the spin-torque transfer (STT) effect, wherein the magnetization direction is changed by passing a relatively high current through the MTJ, perpendicular to the layers forming the MTJ. Thus, the MTJ is switchable between a parallel state and an anti-parallel state.

A relative orientation of the magnetization directions of the reference layer and the free layer determines an electric resistance of the MTJ. The MTJ may present a relatively low resistance when the magnetization of the reference layer and the free layer are aligned or parallel and a relatively high resistance when the magnetization directions of the reference layer and the free layer are anti-parallel with respect to each other.

The tunnel magneto-resistance ratio (TMR) is a measure of the difference in the MTJ electrical resistance between the anti-parallel state and the parallel state. The different states of the free layer/MTJ, and accordingly the different resulting resistance levels, may be used to represent either a logic "1" or a logic "0". A reading operation of the MTJ may be performed by measuring a resistance of the MTJ to a "read current" passed through the MTJ.

SUMMARY

An objective of the present disclosure is to provide an MTJ unit enabling increased memory densities by allowing multi-bit storage and/or multi-bit memory cells. Further or alternative objectives may be understood from the following description.

According to an aspect of the present disclosure there is provided an MTJ unit, comprising: a first MTJ comprising, in a bottom-up direction, a first free layer, a first tunnel barrier layer and a first reference layer, wherein the first MTJ is switchable between a parallel state and an anti-parallel state through spin-torque transfer, STT, wherein the first MTJ has a first STT state switching current threshold, and the first MTJ has a first resistance when in the parallel state and a second resistance when in the anti-parallel state; a second MTJ arranged above the first MTJ and comprising, in a bottom-up direction, a second reference layer, a second tunnel barrier layer and a second free layer, wherein the second MTJ is switchable between a parallel state and an anti-parallel state through STT, wherein the second MTJ has a second STT state switching current threshold different from the first STT state switching current threshold, and the second MTJ has a third resistance when in the parallel state and a fourth resistance when in the anti-parallel state, wherein the first resistance through fourth resistance are different; and a pinning layer arranged between the first reference layer and the second reference layer and configured to fix a magnetization direction of the first reference layer and the second reference layer.

According to an example MTJ unit, a pinning layer is arranged between the first and the second MTJ and configured to fix the magnetization direction of both the first and second reference layers. Hence the pinning layer may be referred to as a common pinning layer of the first MTJ and the second MTJ. Having a common pinning layer for the first and the second MTJ can allow for reducing the number of stack layers and hence the height of the stack, compared to stacking two MTJs with separate pinning layers on top of each other. The reduced number of stack layers may hence reduce the required number of processing steps to fabricate such MTJs as well as facilitate etching of the layer stack.

By the first and second STT state switching current thresholds being different, the MTJ unit is configurable in/switchable into four distinct magnetic states wherein the first and second MTJs are in their respective parallel (P) or anti-parallel (AP) states. Hence, the four states may be denoted "PP", "PAP", "APAP" and "APP". These four different states may be used as four distinct logical levels associated with a respective unique two-bit state, e.g. "00", "01", "10", and "11". Due to the two MTJs having different state-dependent resistance levels, these four distinct magnetic states may be separated and detected during read out.

By a "parallel state" for the first MTJ is hereby meant that a magnetization direction of the first free layer is switched to a direction parallel to the magnetization direction of the first reference layer. By an "anti-parallel state" for the first MTJ is hereby meant that a magnetization direction of the first free layer is switched to a direction anti-parallel to the magnetization direction of the first reference layer.

Similarly, by a "parallel state" for the second MTJ is hereby meant that a magnetization direction of the second free layer is switched to a direction parallel to the magnetization direction of the second reference layer. By an "anti-parallel state" for the second MTJ is hereby meant that a magnetization direction of the second free layer is switched to a direction anti-parallel to the magnetization direction of the second reference layer.

As used herein, a free layer of an MTJ is a layer having a (net) magnetization which may be varied. That is, the direction of the magnetization vectors or magnetic moments of the free layer may be varied. The direction of the magnetization of the free layer may be varied between two states, a "parallel" state wherein the magnetization direction of the free layer is parallel to the magnetization direction of the reference layer of the MTJ and an "anti-parallel" state wherein the magnetization direction of the free layer is anti-parallel to the magnetization direction of the reference layer of the MTJ. The free layer may also be referred to as a storage layer. The magnetization of the free layer may be oriented in-plane (in-plane magnetic anisotropy) or out of plane (perpendicular magnetic anisotropy, PMA). The free layer may be a ferromagnetic layer.

By an STT state switching current threshold of an MTJ is hereby meant the minimum current required to switch the magnetic state of the MTJ, for instance from a P state to an AP state.

A tunnel barrier layer of an MTJ is a layer arranged between the reference layer and the free layer of the MTJ. The tunnel barrier layer may be adapted to allow a tunneling current across the tunnel barrier layer. The tunnel barrier layer may be a non-magnetic and electrically insulating layer.

A reference layer of an MTJ is a layer having a magnetization which is fixed or pinned. That is, the direction of the magnetization vectors or magnetic moments of the reference layer is fixed or pinned. The reference layer may also be referred to as the fixed layer or the pinned layer. The magnetization of the reference layer may be oriented in-plane (in-plane magnetic anisotropy) or out of plane (PMA). The reference layer may be a ferromagnetic layer.

A pinning layer of an MTJ may be a hard magnetic layer having a high (magnetic) coercivity. The pinning layer enables the magnetization direction of one or more associated reference layers to be pinned. By the pinning effect exerted on the reference layer(s), the reversal field of the reference layer may be increased compared to the free layer. The magnetization of the hard magnetic layer may be oriented in-plane (in-plane magnetic anisotropy) or out of plane (PMA).

As used herein, the term "bottom-up" denotes a direction parallel to a stacking direction of the layers starting from the first or the lowest layer. In other words "bottom-up direction" may refer to the order of the layers forming part of the device, i.e. the layer stack, in relation to a substrate supporting the MTJ unit. The terminology "bottom-up direction" does hence not refer to an absolute orientation of the layers but to a relative ordering or a sequence of the layers forming the device and the MTJ structure, or the sequence in which the layers are formed.

Similarly, one layer being arranged or formed "above" another layer is used to define that said one layer is arranged at a level above said other layer as seen in a direction from the substrate. Said one layer is accordingly arranged farther away from the substrate than said other layer.

One layer may be arranged "on" another layer by being arranged directly on, i.e. above and in contact with, said other layer. One layer may also be arranged "on" another layer by being arranged on said other layer with one or more intermediate layers present in between.

In the following, when reference is made to a sublayer of a layer having a multilayer structure (for instance a free layer, a reference layer or a pinning layer having at least two sublayers of different properties, type, or material), the prefix "sub" in "sublayer" may be omitted for brevity.

The first MTJ and the second MTJ may present a cross-sectional dimension which decreases along a bottom-up direction of the MTJ unit. Accordingly, a cross-sectional dimension of the first free layer may be greater than a cross-sectional dimension of the second free layer. The cross-sectional dimension may also be referred to as the critical dimension of the MTJs and the MTJ unit. As the energy barrier to overcome to cause switching of the magnetization direction of a free layer is dependent on the cross-sectional dimension of the free layer, the first and the second MTJs may together provide the four distinct magnetic states of the MTJ unit, i.e. the states "PP", "PAP", "APAP" and "APP". Additionally or alternatively, the current density may change for a given applied current due to the dimensional differences providing four additional states. Additionally or alternatively, the first free layer and the second free layer may present different volumes. This also enables the first and the second MTJs to together provide the four distinct magnetic states of the MTJ unit. The total magnetic moment of a free layer is proportional to the volume of the free layer. The energy barrier to overcome to cause switching of the magnetization direction of the free layer is in turn proportional to the magnetic moment of the free layer.

According to one embodiment the MTJ unit further comprises: a first coupling layer arranged between the first reference layer and the pinning layer, wherein a magnetization of the first reference layer is coupled antiparallel to a magnetization of the pinning layer, through the first coupling layer. Additionally or alternatively, the MTJ unit may further comprise a second coupling layer arranged between the pinning layer and the second reference layer, wherein a magnetization of the second reference layer is coupled antiparallel to the magnetization of the pinning layer, through the second coupling layer.

Thereby, the MTJ unit may comprise a one or two synthetic anti-ferromagnetic (SAF) configuration(s). A first SAF may be formed by the common pinning layer, the first coupling layer and the first reference layer. A second SAF may be formed by the common pinning layer, the second coupling layer and the second reference layer. A SAF-based system enables a reliable pinning of the first/second reference layer. A SAF-based pinning-reference layer system further enables stray field reduction due to the oppositely oriented magnetization directions of the first/second reference layers and the common pinning layer. The stray field of an MTJ refers to the magnetic field originating from the reference layer and the pinning layer of the MTJ. This stray field shifts the free layer reversal point away to a non-zero value. This stray field thus contributes to the offset field of the free layer. The offset field is the field strength that one would need to apply to get the free layer reversal point back to zero. The stray field of the reference layer and pinning layer is a main contributor to the offset field.

By an antiparallel coupling of a magnetization of a pinning layer to a magnetization of a reference layer through a coupling layer is hereby meant that the magnetization of the pinning layer is coupled antiparallel to the magnetization of the reference layer such that the magnetizations of the pinning layer and the reference layer are (fixed) antiparallel.

The coupling layers of the MTJ unit may be a respective non-magnetic layer. The coupling layer may be a transition metal-including layer providing an RKKY-coupling oscillating between parallel and antiparallel as a function of layer thickness, wherein the thickness of the transition metal layer is such that the RKKY-coupling is either parallel or anti-parallel. A transition metal-including layer providing an oscillating RKKY-coupling (or shorter "RKKY-metal") makes it possible to provide a coupling- and etch barrier-function by appropriately selecting the thickness thereof. The RKKY coupling is also known as the Ruderman-Kittel-Kasuya-Yosida interaction.

According to one embodiment, a magnetization of the first reference layer is coupled parallel to a magnetization of the pinning layer. Alternatively or additionally a magnetization of the second reference layer may be coupled parallel to the magnetization of the pinning layer. The MTJ unit may further comprise a magnetic stray field compensation layer arranged below the first MTJ or above the second MTJ.

By a parallel coupling of a magnetization of a pinning layer to a magnetization of a reference layer through a coupling layer is hereby meant that the magnetization of the pinning layer is coupled parallel to the magnetization of the reference layer such that the magnetizations of the pinning layer and reference layer are (fixed) parallel. The parallel coupling may be provided through a coupling layer between the pinning layer and the reference layer. Many typical coupling layer materials allow a sufficiently strong parallel coupling also for comparably thick layers. A thicker coupling layer may in turn improve the thermal robustness of the coupling layer and hence of the overall layer stack.

In a parallel coupling configuration a magnetic stray field compensation layer may provide compensation of the offset field. The compensation layer may be combined with an additional layer in the form of a non-magnetic layer to provide magnetic isolation The coupling layer may be a Ru-, Ir-, Os-, or Rh-including layer.

These materials allow forming of a coupling layer providing a sufficiently strong coupling and a texture compatible with materials typically used in state of the art MTJs.

The first reference layer may comprise a first ferromagnetic layer pair of a first lower and upper ferromagnetic layer and a first texture breaking layer arranged between the first ferromagnetic layer pair.

The second reference layer may comprise a second ferromagnetic layer pair of a second lower and upper ferromagnetic layer and a second texture breaking layer arranged between the second ferromagnetic layer pair.

The first texture breaking layer allows "breaking of a texture" between the first lower and upper ferromagnetic layers such that a texture of the first upper ferromagnetic layer may be selected to facilitate forming of a properly textured common pinning layer. Correspondingly, the second texture breaking layer allows "breaking of a texture" between the common pinning layer and the second lower ferromagnetic layer such that a texture of the second lower ferromagnetic layer may be selected to facilitate forming of properly textured layers of the second MTJ.

The first and the second texture breaking layer further enable independent tuning of net stray fields acting on the free layers of the first and second MTJ, although the MTJ unit comprises a common pinning layer.

Accordingly, the first and second texture breaking layers may have different thickness. Providing first and second texture breaking layers with different thickness may be combined with anti-parallel coupled pinning layer and reference layers wherein a stray field compensation effect of the pinning layer may be tuned for the first and the second MTJ by varying the thickness of the respective texture breaking layers. By increasing the thickness of a texture breaking layer the common pinning layer may be further separated from the corresponding free layer wherein the stray field of the corresponding reference layer acting on the corresponding free layer may be less compensated, and vice versa.

According to a second aspect there is provided a memory device comprising a plurality of memory cells, each memory cell comprising a first MTJ unit according to the first aspect and a second MTJ unit according to the first aspect, wherein the STT state switching current thresholds of the first and second MTJ units are different from each other, and wherein the state-dependent resistances of the first and second MTJ units are different from each other.

According to an example memory device, two MTJ units may form part of a common memory cell of a memory device. Different STT state switching current thresholds of the first and second MTJ units allows individual control of the states of the four MTJs forming the memory cell. Analogous to the above discussion concerning the four states of the MTJ unit of the first aspect, two MTJ units provide sixteen different states, which may be associated with sixteen logic levels and hence four bits. Due to the four MTJs of the two MTJ units having different TMRs, these sixteen distinct levels may be separated and detected during read out.

The first MTJ units of the memory cells may be formed as identical MTJ units. Accordingly each of the first MTJ units may be configured to present a same first STT switching current threshold and a same second STT switching current threshold. Further, each of the first MTJ units may be configured to present a same first resistance, a same second resistance, a same third resistance and a same fourth resistance. Correspondingly, the second MTJ units of the memory cells may be formed as identical MTJ units. Accordingly each of the second MTJ units may be configured to present a same first STT switching current threshold and a same second STT switching current threshold. Further, each of the second MTJ units may be configured to present a same first resistance, a same second resistance, a same third resistance and a same fourth resistance.

Within examples, the first MTJ unit and the second MTJ unit may be connected in series to each other. A series connection of the MTJ units allows formation of a multibit memory cell in an electrically simple manner. A series connection makes it possible to use a common write path and a common read path for the two MTJ units.

The memory device may comprise a respective select device connected to each memory cell, wherein each select device has a first terminal connected to a bit line, wherein the first and the second MTJ units are connected between a second terminal of the select device and a sense line. Each memory cell may thereby be addressed by means of a respective select device. Each selector device may be a select transistor having a gate terminal coupled to a word line.

According to one embodiment, the memory device comprises an interconnect structure and wherein the first and second MTJ units are arranged in a dielectric layer of a same interconnection level of the interconnect structure. Hence, the multi-bit memory cells may be arranged in a common dielectric layer between conductive lines of two adjacent interconnection layers, wherein the first and second MTJ units of each memory cell are arranged in a same layer or level of the interconnection structure. This configuration may allow a height efficient implementation of a memory device since the MTJ units need only occupy a single dielectric layer.

The interconnection level may form a second interconnection level of a multi-level interconnect structure of the memory device, and the interconnect structure may further comprise a first interconnection level wherein the second interconnection level is arranged above the first interconnection level, wherein the first interconnection level comprises first and second conductive lines, and the second interconnection level comprises third and fourth conductive lines, and wherein the first MTJ unit is connected between the first and third conductive lines and the second MTJ unit is connected between the second and fourth conductive lines, and wherein the second and the third conductive line are connected by a conductive via extending through the dielectric layer. This configuration may enable short signal paths between the MTJ units of each respective memory cell since the MTJ units of each memory cell may be arranged adjacent to each other and interconnected by a single via.

According to one embodiment, each one of the first MTJ units are arranged in a first region of the memory device and wherein each one of the second MTJ units are arranged in a second region of the memory device, wherein the first and second regions are arranged in a dielectric layer arranged between a first interconnection layer and a second interconnection layer.

Forming the first MTJ units and second MTJ units in two different non-overlapping regions of the memory device, may simplify integration since the first MTJ units and the second MTJ units may be formed in two separate processes. I.e. the first MTJ units may be formed in parallel to each other during a first common process and thereafter the second MTJ units may be formed in parallel to each other during a second common process. The first MTJ units in the first region may be arranged in a first MTJ unit array. The second MTJ units in the second region may be arranged in a second MTJ unit array.

According to one embodiment, each one of the first MTJ units are arranged in a first region of the memory device and wherein each one of the second MTJ units are arranged in a second region of the memory device, wherein the first region is arranged in a first dielectric layer arranged between a first interconnection layer and a second interconnection layer and the second region is arranged in a second dielectric layer arranged above the second interconnection layer.

Forming the first MTJ units and second MTJ units in two different regions in different levels of the memory device, may simplify integration since the first MTJ units and the second MTJ units may be formed in two separate processes. I.e. the first MTJ units may be formed in parallel to each other during a first common process and thereafter the second MTJ units may be formed in parallel to each other during a second common process. The first MTJ units in the first region may be arranged in a first MTJ unit array. The second MTJ units in the second region may be arranged in a second MTJ unit array.

The memory device may further comprise a controller configured to selectively couple one of the first MTJ units in the first region in series with one of the second MTJ units in the second region.

This provides the possibility to pair any two MTJ units from the first and the second memory regions. Hence, multi-level memory cells may be dynamically configured by the controller selectively coupling a selected first MTJ unit to a selected second MTJ unit.

BRIEF DESCRIPTION OF THE FIGURES

The above, as well as additional, features will be better understood through the following illustrative and non-limiting detailed description of example embodiments, with reference to the appended drawings. In the drawings like reference numerals will be used for like elements unless stated otherwise.

FIGS. 5a-5b show a side and top view schematic illustration, respectively, of an alternative memory cell, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
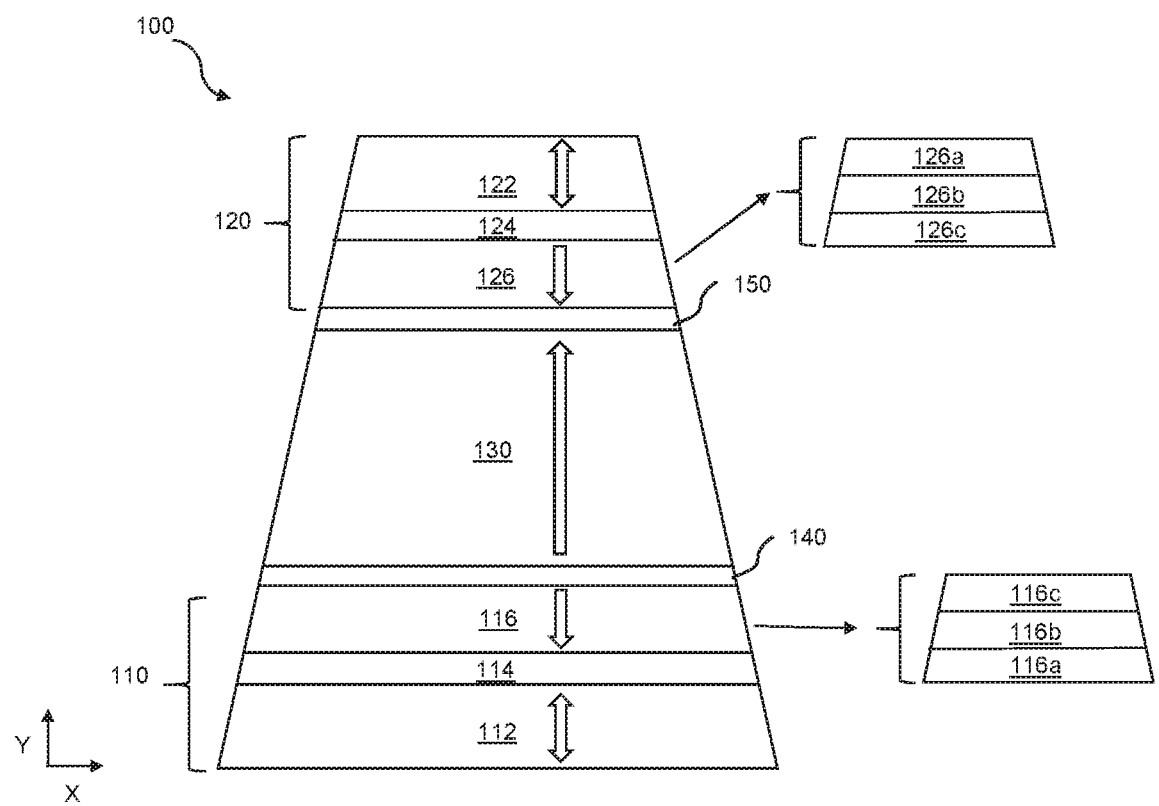
FIG. 1 is a side view schematic illustration of an MTJ unit comprised of two MTJs with a common pinning layer, according to an example embodiment.

FIG. 1 illustrates a schematic side view of an MTJ unit 100. In FIG. 1 "Y" denotes a vertical or bottom-up direction. "X" denotes a horizontal direction. It should be noted that for the purpose of clarity the various layers and other features of the stacks are not drawn to scale and their relative dimensions, in particular their thickness, may differ from a physical stack. Typically, unless stated otherwise in the following, each of the layers of the MTJ unit 100 may be formed with a thickness of a few Å to a few tens of Å.

The MTJ unit 100 comprises in a bottom-up direction a first MTJ 110, a common pinning layer 130 and a second MTJ 120. The first MTJ 110 comprises, in a bottom-up direction, a first free layer 112, a first tunnel barrier layer 114 and a first reference layer 116. The second MTJ 120 is arranged above the first MTJ 110 and comprises, in a bottom-up direction, a second reference layer 126, a second tunnel barrier layer 124 and a second free layer 122. The pinning layer 130 is arranged between the first reference layer 116 and the second reference layer 126 and configured to fix a magnetization direction of the first reference layer 116 and the second reference layer 126.

As schematically indicated by the up-down arrows in the free layers 112, 122, the magnetizations of the free layers 112, 122 may be set into two different states or directions. That is, the magnetization of the first free layer 112 may be set either parallel (P) or anti-parallel (AP) with respect to the magnetization of the first reference layer 116. The magnetization of the second free layer 122 may be set either P or AP with respect to the magnetization of the second reference layer 126. Accordingly, four distinct magnetic configurations or states are possible for the MTJ 100:

"PP": first free layer 112 set to P and second free layer 122 set to P; "PAP": first free layer 112 set to P and second free layer 122 set to AP; "APAP": first free layer 112 set to AP and second free layer 122 set to AP;

"APP": first free layer 112 set to AP and second free layer 122 set to P.

The first MTJ 110 has a first resistance R1 when in the P state and a second resistance R2 when in the AP state. The second MTJ 120 has a third resistance R3 when in the P state and a fourth resistance R4 when in the AP state. The four resistance levels R1-R4 are different from each other. Accordingly, each of the four magnetic states will result in a unique resistance of the MTJ unit 100. Thereby, the magnetic state of the MTJ unit 100 may be detected by applying a voltage across the MTJ unit 100 (thus biasing the first MTJ 110 and the second MTJ 120) and measuring the resulting resistance. The magnetic state-independent resistance of all other layers of the MTJ unit 100, other than the layers of the first and second MTJs 110, 120, may be denoted R0. The total resistance of the MTJ unit 100 may be denoted Rtot. Accordingly, the "PP" state yields Rtot=R0+R1+R3. The "PAP" state yields Rtot=R0+R1+R4. The "APAP" state yields Rtot=R0+R2+R4. The "APP" state yields Rtot=R0+R2+R3. Each distinct resistance level Rtot (or corresponding voltage level) may be used as a distinct logic level which in turn may be associated with a respective two-bit value. For instance, the "PP" state may represent "00". The "PAP" state may represent "01". The "APP" state may represent "10". The "APAP" state may represent "11". However, any other permutation of the magnetic state-bit value association is equally possible.

The MTJ unit 100 may as shown in FIG. 1 be formed with a tapered pillar-shape. The MTJ unit 100 may thereby be formed to present a decreasing cross-sectional dimension/cross-sectional area in the bottom-up direction. For an MTJ unit 100 with a circular cross-section, the diameter of the MTJ unit 100 may be decreasing in the bottom-up direction. In FIG. 1 the tapering of the MTJ unit 100 is gradual. However, independently controllable magnetic states of the MTJ unit 100 may also be achieved by varying the cross-sectional dimension in a step-wise manner such that a cross-sectional dimension of the layers of the first MTJ unit 100 and a cross-sectional dimension of the layers of the second MTJ unit 200 are different. In any case, the MTJ unit 100 may be formed such that the first free layer 112 presents a first cross-sectional dimension and the second free layer 122 presents a second cross-sectional dimension which is smaller than the first cross-sectional dimension. The first and second cross-sectional dimensions may each fall within the range of 30-500 nm. Additionally, or alternatively the free layers 112 and 122 may be formed with different thickness such that the free layers 112, 122 present different volumes. For instance, the MTJ unit may be designed by first measuring the impact of the different critical dimensions on the critical switching current and thereafter further tuning the critical switching current by varying the layer free layer thickness.

In addition to forming the MTJ unit 100 with a tapering or different free layer volumes, or alternatively thereto, the four distinct magnetic states of the MTJ unit 100 may also be achieved by adapting the damping and/or anisotropy of the free layers 112, 122. This may be achieved for instance by including W in the free layers 112, 122 and/or by a variation of the free layer thickness.

The first free layer 112 may be formed by a ferromagnetic material. Examples of ferromagnetic materials for the free layer include Fe, Co, FeB, CoB, CoFe, and CoFeB. The free layer 112 may also have a multi-layer structure including combinations of the afore-mentioned materials, for instance a free layer formed of CoFeB/X/CoFeB tri-layers where X denotes for instance Ta, W, or Mo.

The first tunnel barrier layer 114 is arranged on and in contact with the first free layer 112. The first tunnel barrier layer 114 may include a layer of a dielectric material, for instance MgO, $AlO_x$, $MgAlO_x$, MgZnO, or $MgTiO_x$. Although FIG. 1 shows an MTJ with a single tunnel barrier configuration, the first MTJ 110 may also include a dual- or multi-tunnel barrier layer configuration. A dual- or multi-tunnel barrier layer configuration may include two or more stacks of free and tunnel barrier layers.

The first reference layer 116 is arranged on and in contact with the first tunnel barrier layer 114. The first free layer 112, the first tunnel barrier layer 114 and the first reference layer 116 are configured to form a first magnetic tunnel junction of the first MTJ 110. The first reference layer 116 may as shown be a multi-layer comprising, in a bottom-up direction, a first lower ferromagnetic layer 116a, a first texture breaking layer 116b, and a first upper ferromagnetic layer 116c. The first lower ferromagnetic layer 116a may be arranged on and in contact with the first tunnel barrier layer 114. The first texture breaking layer 116b may be arranged on and in contact with the first lower ferromagnetic layer 116a. The first upper ferromagnetic layer 116c may be arranged on and in contact with the first texture breaking layer 116b. The first lower ferromagnetic layer 116a may be a CoFeB-layer.

The texture breaking layer 116b may be a Ta, Mo, or W-including layer. The texture breaking layer may also be of CoFeX or FeX or CoX, where X is Ta, Mo, or W. The texture breaking layer 116b may be formed with a thickness in the range of 0.2-1 nm. The upper ferromagnetic layer 116c may be a Co-based layer, such as a Co-layer (e.g. with a [111] texture), a CoX/Co alloy, or a [Co/X]/Co laminate with X=Fe, Pt, Pd, Ni, i.e. with the Co-layer forming a top layer of the laminate or alloy. The top (sub-)layer of the upper ferromagnetic layer 116c may also be a Co-rich CoX alloy with X being Fe, Pt, Ni, Pd, Tb, Gd with Co %>60. The upper ferromagnetic layer 116c may be formed with a thickness in the range of 0.4-4 nm. The first lower ferromagnetic layer 116a may be a CoFeB-layer formed to present a [001] texture. The CoFeB-layer may be formed with a thickness in the range of 0.5-2 nm. The second MTJ 120 may comprise a layer stack corresponding to that of the first MTJ 110. As shown in FIG. 1, the second reference layer 126 comprises a second lower ferromagnetic layer 126c. The second reference layer 126 comprises a second texture breaking layer 126b arranged on and in contact with the second lower ferromagnetic layer 126c. The second reference layer 126 comprise a second upper ferromagnetic layer 126a arranged on and in contact with the second texture breaking layer 126b. The second tunnel barrier layer 124 is arranged on and in contact with the second reference layer 126. The second free layer 122 is arranged on and in contact with the second tunnel barrier layer 124. The second reference layer 126, the second tunnel barrier layer 124 and the second free layer 122 are configured to form a second magnetic tunnel junction of the second MTJ 110.

The layers 122, 124, 126a-c may be formed of the same compositions as listed in connection with the corresponding layers of the first MTJ 110.

As shown in FIG. 1, the pinning layer 130 may be arranged on and in contact with a first coupling layer 140. The pinning layer may be formed by a high-coercivity material. The hard magnetic layer may include a laminate (i.e. a "superlattice") of [Co/Pd], [Co/Pt], or [Co/Ni] bilayers, repeated a number of times, such as 4-8. Other possible compositions of the pinning layer include a Co-layer, an Fe-layer or a CoFe-layer or a laminate of a [Fe/X] or [CoFe/X], repeated a number of times, where X denotes Pd, Pt, Ni, Tb, or Gd. A pinning layer having an alloy composition is also possible, such as an alloy of Co, Fe, or CoFe and Pt, Pd, Ni, Tb, or Gd. Further examples include ternary alloys of CoXCr, where X denotes Pt, Ni, Pd, Tb, or Gd. The top and bottom layer of the pinning layer may be formed by a respective Co-layer or Co-rich layer, such as a Co-rich CoX alloy with X is Fe, Pt, Ni, Pd, Tb, Gd with Co %>60, thickness range 0.4-1.3 nm.

The magnetization of the pinning layer 130 is coupled anti-parallel to the respective magnetizations of the first and second reference layers 116, 126. The anti-parallel coupling is provided by first and second coupling layers 140, 150. The first coupling layer 140 is arranged as an interface layer between the first reference layer 116 and the pinning layer 130. The second coupling layer 150 is arranged as an interface layer between the pinning layer 130 and the second reference layer 126.

The first coupling layer 140 may be a layer including or consisting of Ru and having a thickness in the range of 4 Å±2 Å or 8.5 Å±2 Å. Thereby, the coupling layer may be of a sufficient thickness to provide an antiparallel coupling between the pinning layer 130 and the first reference layer 116. The coupling layer 140 may also be a layer including or consisting of Ir and having a thickness in the range of 5 Å±2 Å, 17 Å±2 Å and thereby provide an antiparallel coupling. The coupling layer 140 may also be a layer including or consisting of Rh and having a thickness in the range of 5 Å±2 Å, 15 Å±2 Å and thereby provide an antiparallel coupling. These options for the first coupling layer 140 apply correspondingly to the second coupling layer 150.

Figure 2:
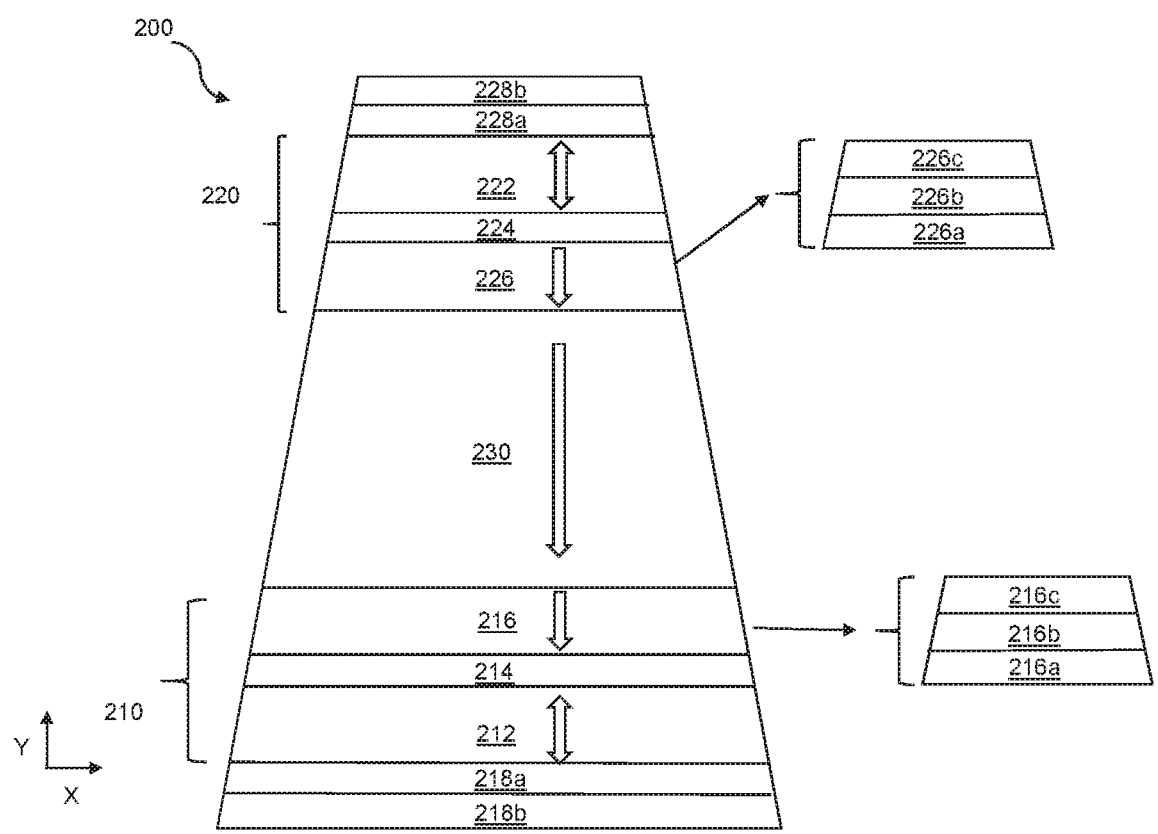
FIG. 2 is a side view schematic illustration of an alternative MTJ unit comprised of two MTJs with a common pinning layer, according to an example embodiment.

FIG. 2 illustrates a side view schematic illustration of an MTJ unit 200 comprised of a first MTJ 210 and a second MTJ 220 with a common pinning layer 230. The first free layer 212, second free layer 222, first tunnel barrier layer 214, second tunnel barrier layer 224, first reference layer 216, and second reference layer 226 may generally be the same as the corresponding first free layer 112, second free layer 122, first tunnel barrier layer 114, second tunnel barrier layer 124, first reference layer 116, and second reference layer 126 shown in FIG. 1. The MTJ unit 200 however differs from the MTJ unit 100 in that the respective magnetizations of the reference layers 216 and 226 are coupled parallel to the magnetization of the pinning layer 230, rather than anti-parallel. A parallel coupling may be achieved by arranging the reference layers 216, 226 in direct contact with the pinning layer 230. A parallel coupling may also be achieved by providing a respective parallel coupling layer intermediate the reference layer 216 and the pinning layer 230 and between the reference layer 226 and the pinning layer 230. Each of the coupling layers may for instance be a Ru-layer with a thickness of 13 Å±2 Å, an Ir-layer with a thickness of 9.5 Å±2 Å or an Rh-layer with a thickness of 8 Å±2 Å.

As shown in FIG. 2 the MTJ unit 200 may further comprise a first magnetic stray field compensation layer 218b and/or a second magnetic stray field compensation layer 228b. The first magnetic stray field compensation layer 218b may be separated from the first free layer 212 by a first non-magnetic spacer layer 218a. The first non-magnetic spacer layer 218a may be arranged below and in contact with the first free layer 212. The first magnetic stray field layer 218b may in turn be arranged below and in contact with the first non-magnetic layer 218a. The second magnetic stray field compensation layer 228b may be separated from the second free layer 222 by a second non-magnetic spacer layer 228a. The second non-magnetic spacer layer 228a may be arranged above and in contact with the second free layer 222. The second magnetic stray field layer 228b may in turn be arranged above and in contact with the second non-magnetic layer 228a.

Figure 3:
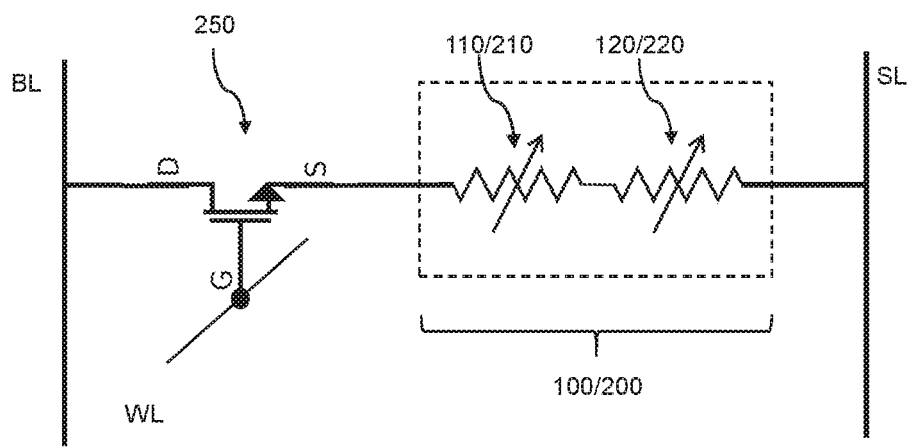
FIG. 3 is a schematic illustration of a logic circuitry for reading and writing operation of an MTJ unit, according to an example embodiment.

FIG. 3 is a schematic circuit diagram of an MTJ unit 100 or 200 implemented in a memory cell or bit cell. The MTJ unit 100/200 is schematically indicated as two series-connected variable resistances formed by first MTJ unit 110/210 and the second MTJ unit 120/220. A memory device may comprise a plurality of similarly configured memory cells arranged in an array of the memory device. As illustrated in FIG. 3, the MTJ unit 100/200 is connected between a terminal of select device in the form of a select transistor 250 and a select line (SL). The other terminal of the select transistor 250 is connected to a bit line (BL). The select transistor 250 may be addressed by a word line (WL) connected to a gate terminal of the select transistor 250, for accessing the MTJ unit 100/200 during reading and writing operations. It is also possible to use a two-terminal select device instead of a select transistor, for instance a thresholding bi-directional device such as bi-directional diode.

Figures 4A, 4B:
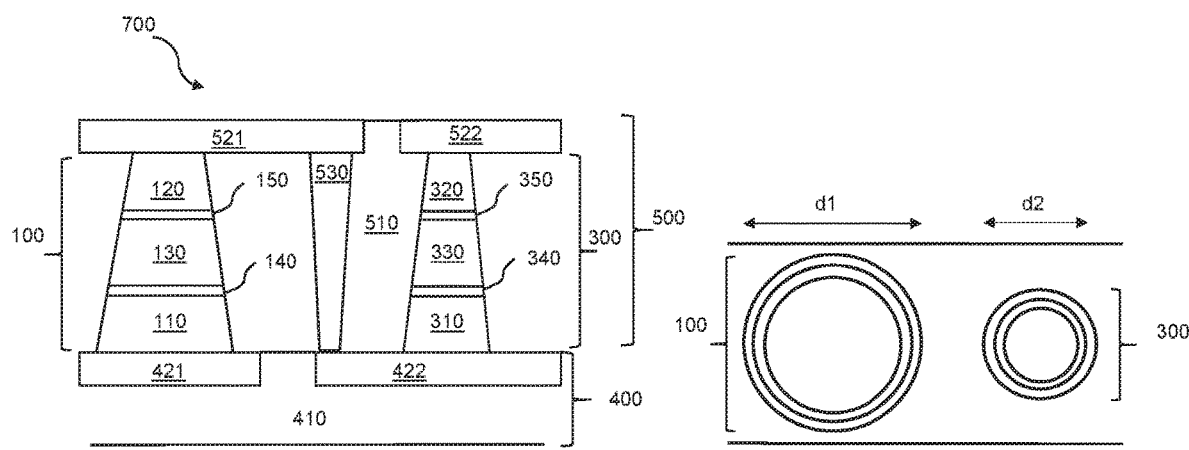
FIGS. 4a-4b show a side and top view schematic illustration, respectively, of a memory cell arranged between a first interconnection layer and a second interconnection layer, according to an example embodiment.

FIG. 4a illustrates a side view schematic illustration of one memory cell of a plurality of similarly configured memory cells. FIG. 4b shows a corresponding top-view. The illustrated memory cell comprises a first MTJ unit 100 and a second MTJ unit 300 connected in series. The above discussion of the various layers and the operation of the first MTJ unit 100 applies correspondingly to the second MTJ unit 300. The second MTJ unit 300 may accordingly comprise a first (or "third") MTJ 310 and a second (or "fourth") MTJ 320 arranged above the first MTJ 310. The second MTJ unit 300 further comprises a common pinning layer 330 coupled anti-parallel to respective reference layers of the first and second MTJs 310, 310 through coupling layers 340, 350. The first MTJ unit 100 and the second MTJ unit 300 are configured to present different STT state switching current thresholds. Thus, the first MTJ unit 100 may be set to any one of the four states "PP", "PAP", "APAP" and "APP", independently from the second MTJ unit 300. Correspondingly, the second MTJ unit 300 may be set to any one of the four states "PP", "PAP", "APAP" and "APP", independently from the second MTJ unit 300. Hence, in combination, the first and second MTJ units 100, 300 may be set to sixteen different magnetic states. Further, the first MTJ unit 100 and the second MTJ unit 300 are configured to present different magnetic state-dependent resistances, thereby allowing the sixteen different states to be distinguished from each other by measuring a total resistance across the first and second MTJ units 100, 300. The different magnetic states and associated distinct resistance levels of the first and second MTJ units 100, 300 may be provided by forming the MTJ units 100, 300 with different cross-sectional/lateral dimensions d1 and d2, as discussed above.

As shown in FIG. 4a, the first and second MTJ units 100, 200 are arranged in a common dielectric layer 510 of an interconnection level 500. The interconnection level 500 forms part of a back-end-of-line (BEOL) or interconnect structure 700. The interconnect structure 700 comprises a lower or first interconnection level 400. The interconnection level 500 is arranged above the first interconnection level 400 and thus forms an upper or second interconnection level 500.

The first interconnection level 400 comprises a set of horizontally extending conductive paths or lines comprising a first line 421 and a second line 422. The set of horizontally conductive lines are arranged in a dielectric layer 410 of the first interconnection level 400. The second interconnection level 500 comprises a set of horizontally extending conductive paths or lines comprising a third line 521 and a fourth line 522. The set of horizontally conductive lines are arranged in the dielectric layer 510 of the second interconnection level 500.

The first MTJ unit 100 is connected between the first line 421 and the third line 521. The second MTJ unit 300 is connected between the second line 422 and the fourth line 522. The second interconnection level 500 further comprises a conductive via 530 extending vertically through the second dielectric layer 510. The via 530 extends between and interconnects the third line 521 and the second line 422. The first and second MTJ units 100, 300 are thus connected in series to each other.

The first MTJ unit 100 may comprise a bottom electrode arranged in direct contact with the first line 421 or connected to the first line 421 by a short bottom via contact. The first MTJ unit 100 may comprise a top electrode arranged in direct contact with the third line 521 or connected to the third line 521 by a short top via contact. The second MTJ unit 200 may comprise a bottom electrode arranged in direct contact with the second line 422 or connected to the second line 422 by a short bottom via contact. The second MTJ unit 200 may comprise a top electrode arranged in direct contact with the fourth line 522 or connected to the fourth line 522 by a short top via contact.

Although, FIG. 4a only shows the schematics of one memory cell of the memory device, it should be noted that each memory cell of the memory device may comprise a respective pair of first and second lines 421, 422 and a respective pair of third and fourth lines 521, 522 connected to a respective pair of first and second MTJ units 100, 300 of the memory cell in the illustrated manner. Each memory cell may further comprise a respective conductive via 530 interconnecting the second and third lines 422, 521 of the respective memory cell.

The interconnect structure 700 may be formed in a conventional BEOL process wherein each interconnection level 400, 500 may be sequentially formed on top of each other. The dielectric layers 410, 510 of the interconnection levels 400, 500 may comprise or be formed of any conventional interlayer dielectrics, for instance silicon oxide or other low K dielectrics. The conductive lines 421, 422, 521, 522 and the conductive via 530 may comprise or be formed of conventional conductive materials such as Cu, W, Au, Ag, Al, Co, Ni, Ru or by highly doped semiconductor materials. The conductive lines and the vias may be formed using conventional damascene style processing, for instance in a dual damascene process. The MTJ units 100, 300 may be formed on the first interconnection level 400 prior to forming the second interconnection level 500, in contact with the first and second conductive lines 421, 422. The MTJ units 100, 300 may thereafter be covered in the dielectric layer 510. The conductive paths 521, 522 and the via 530 may thereafter be formed in the dielectric layer 510, thereby completing the second interconnection level 500.

FIGS. 5a and 5b illustrate a side view and top view, respectively, of a memory cell of an alternative design. According to the alternative design. As shown in the figures, the first MTJ unit 100 and the second MTJ unit 300 are arranged in two different interconnection levels 500 and 600. The first MTJ unit 100 is connected between a conductive line 421 of the first interconnection level 400 and a conductive line 521 of the second interconnection level 500. The second MTJ unit 300 is connected between the conductive line 521 and a conductive line 621 of a third interconnection level 600. The first MTJ unit 100 and the second MTJ unit 300 are thus connected in series to each other through the common conductive line 521 of the second metallization level 500.

Figure 6:
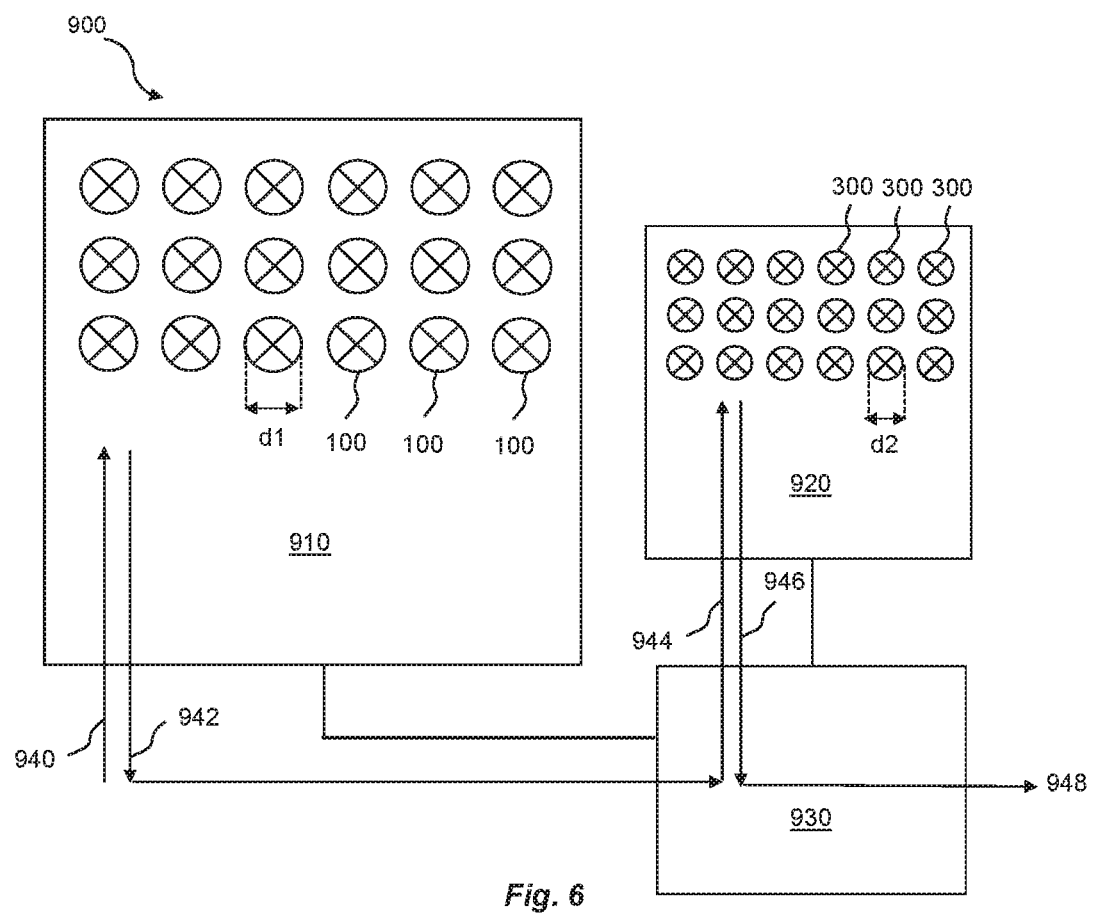
FIG. 6 is a top view schematic of a memory device, according to an example embodiment.

FIG. 6 is a top view schematic illustration of a memory device 900 according to a further variation. The memory device 900 comprises a first memory region 910 and a second memory region 920. The first memory region 910 comprises a plurality of substantially identically formed first MTJ units 100, each corresponding to the above described MTJ unit 100. The second memory region 920 comprises a plurality of substantially identically formed second MTJ units 300, each corresponding to the above described MTJ unit 300. The first MTJ units 100 may be arranged in an array in the first memory region 910. The second MTJ units 300 may be arranged in an array in the second memory region 920. The first and second memory regions 910, 920 form different and non-overlapping regions of the memory device. The first MTJ units 100 and the second MTJ units 300 may be arranged in a common dielectric layer of a same interconnection level of an interconnect structure of the memory device. However, the first MTJ units 100 and the second MTJ units 300 may also be arranged in different dielectric layers of different interconnection levels of an interconnect structure of the memory device.

The illustrated memory device 900 further comprises a controller 930 configured to selectively couple one of the first MTJ units 100 in the first region 910 in series with one of the second MTJ units 300 in the second region 920. This may provide flexibility since any MTJ unit in the first region 910 may be connected to any MTJ unit in the second region 920. This may for instance allow implementing arithmetic operations, such as multiplication, during read out. This may further allow MTJ in units in the first region 910 to be read and/or written independently from the MTJ units in the second region 920, and vice versa. This may facilitate and improve the reliability of the reading and/or writing operation.

The example embodiments provided herein have mainly been described with reference to a limited number of examples. However, as is readily appreciated by a person skilled in the art, other examples than the ones disclosed above are equally possible within the scope of the disclosure, as defined by the appended claims. For instance, although only the MTJ unit 200 of FIG. 2 comprises a first and/or second magnetic stray field compensation layer 218a, 218b, it is also possible to include a first and/or second magnetic stray field compensation layer (and an associated non-magnetic spacer layer) in the first MTJ unit 100. This may allow a further stray field compensation. Moreover, it is possible to combine anti-parallel and parallel coupling configurations within a single MTJ unit. For instance, the pinning layer 130 of the MTJ unit 100 may be coupled parallel to the first reference layer 116 and coupled anti-parallel to the second reference layer 126, or vice versa. Additionally, although FIGS. 4-6 show configurations combining MTJ units 100 and 300 with an anti-parallel coupling between the pinning and reference layers, this is not the only possibility. In one variation, a first and a second MTJ unit, each having a parallel coupling between the pinning and reference layers (i.e. corresponding to the MTJ unit 200), may be combined in a memory cell. In another variation, a first and a second MTJ unit, one having an anti-parallel coupling (i.e. corresponding to the MTJ unit 100) and one having a parallel coupling (i.e. corresponding to the MTJ unit 200), may be combined in a memory cell.

While some embodiments have been illustrated and described in detail in the appended drawings and the fore-

What is claimed is:

1. A magnetic tunnel junction (MTJ) unit comprising:
a first MTJ comprising, in a bottom-up direction, a first free layer, a first tunnel barrier layer and a first reference layer, wherein the first MTJ is switchable between a parallel state and an anti-parallel state through spin-torque transfer, STT, wherein the first MTJ has a first STT state switching current threshold, and the first MTJ has a first resistance when in the parallel state and a second resistance when in the anti-parallel state, and wherein the first reference layer comprises a first ferromagnetic layer pair and a first texture breaking layer arranged between the first ferromagnetic layer pair;
a second MTJ arranged above the first MTJ and comprising, in a bottom-up direction, a second reference layer, a second tunnel barrier layer and a second free layer, wherein the second MTJ is switchable between a parallel state and an anti-parallel state through STT, wherein the second MTJ has a second STT state switching current threshold different from the first STT state switching current threshold, and the second MTJ has a third resistance when in the parallel state and a fourth resistance when in the anti-parallel state, wherein the first resistance through fourth resistance are different, wherein the second reference layer comprises a second ferromagnetic layer pair and a second texture breaking layer arranged between the second ferromagnetic layer pair, and wherein the first and second texture breaking layers have different thicknesses; and
a pinning layer arranged between the first reference layer and the second reference layer and configured to fix a magnetization direction of the first reference layer and the second reference layer.

2. The MTJ unit according to claim 1, further comprising:
a first coupling layer arranged between the first reference layer and the pinning layer, wherein a magnetization of the first reference layer is coupled antiparallel to a magnetization of the pinning layer, through the first coupling layer; and/or
a second coupling layer arranged between the pinning layer and the second reference layer, wherein a magnetization of the second reference layer is coupled antiparallel to the magnetization of the pinning layer, through the second coupling layer.

3. The MTJ unit according to claim 2, wherein the first coupling layer and/or the second coupling layer is a Ru-, Ir-, Os-, or Rh-including layer.

4. The MTJ unit according to claim 1, further comprising:
a first coupling layer arranged between the first reference layer and the pinning layer, wherein a magnetization of the first reference layer is coupled antiparallel to a magnetization of the pinning layer, through the first coupling layer, wherein the first MTJ comprises a first synthetic anti-ferromagnetic (SAF) configuration formed by the pinning layer, the first coupling layer and the first reference layer.

5. The MTJ unit according to claim 4, further comprising:
a second coupling layer arranged between the pinning layer and the second reference layer, wherein a magnetization of the second reference layer is coupled antiparallel to the magnetization of the pinning layer, through the second coupling layer, wherein the second MTJ comprises a second SAF configuration formed by the pinning layer, the second coupling layer and the second reference layer.

6. The MTJ unit according to claim 5, wherein the first coupling layer comprises a non-magnetic layer and wherein the second coupling layer comprises a non-magnetic layer.

7. The MTJ unit according to claim 1, wherein a magnetization of the first reference layer is coupled parallel to a magnetization of the pinning layer and/or a magnetization of the second reference layer is coupled parallel to the magnetization of the pinning layer, and wherein the MTJ unit further comprises a magnetic stray field compensation layer below the first MTJ or above the second MTJ.

8. A memory device comprising a plurality of memory cells, each memory cell comprising a first MTJ unit and a second MTJ unit,
wherein each MTJ unit comprises:
a first MTJ comprising, in a bottom-up direction, a first free layer, a first tunnel barrier layer and a first reference layer, wherein the first MTJ is switchable between a parallel state and an anti-parallel state through spin-torque transfer, STT, wherein the first MTJ has a first STT state switching current threshold, and the first MTJ has a first resistance when in the parallel state and a second resistance when in the anti-parallel state, and wherein the first reference layer comprises a first ferromagnetic layer pair and a first texture breaking layer arranged between the first ferromagnetic layer pair;
a second MTJ arranged above the first MTJ and comprising, in a bottom-up direction, a second reference layer, a second tunnel barrier layer and a second free layer, wherein the second MTJ is switchable between a parallel state and an anti-parallel state through STT, wherein the second MTJ has a second STT state switching current threshold different from the first STT state switching current threshold, and the second MTJ has a third resistance when in the parallel state and a fourth resistance when in the anti-parallel state, wherein the first resistance through fourth resistance are different, wherein the second reference layer comprises a second ferromagnetic layer pair and a second texture breaking layer arranged between the second ferromagnetic layer pair, and wherein the first and second texture breaking layers have different thicknesses; and
a pinning layer arranged between the first reference layer and the second reference layer and configured to fix a magnetization direction of the first reference layer and the second reference layer;
wherein the STT state switching current thresholds of the first and second MTJ units are different from each other, and
wherein the respective resistances of each STT state of the first MTJ unit is different from corresponding resistances of each STT state of the second MTJ unit.

9. The memory device according to claim 8, wherein the first MTJ unit and the second MTJ unit of each memory cell are connected in series to each other.

10. The memory device according to claim 8, wherein the memory device comprises an interconnect structure and wherein the first and second MTJ units are arranged in a dielectric layer of a same interconnection level of the interconnect structure.

11. The memory device according to claim 10, wherein the interconnection level forms a second interconnection level of a multi-level interconnect structure of the memory device, the interconnect structure further comprising a first interconnection level wherein the second interconnection level is arranged above the first interconnection level, wherein the first interconnection level comprises first and second conductive lines, and the second interconnection level comprises third and fourth conductive lines, and wherein the first MTJ unit is connected between the first and third conductive lines and the second MTJ unit is connected between the second and fourth conductive lines, and wherein the second and the third conductive lines are connected by a conductive via extending through the dielectric layer.

12. The memory device according to claim 8, wherein each one of the first MTJ units are arranged in a first region of the memory device and wherein each one of the second MTJ units are arranged in a second region of the memory device, wherein the first and second regions are arranged in a dielectric layer arranged between a first interconnection layer and a second interconnection layer.

13. The memory device according to claim 8, wherein each one of the first MTJ units are arranged in a first region of the memory device and wherein each one of the second MTJ units are arranged in a second region of the memory device, wherein the first region is arranged in a first dielectric layer arranged between a first interconnection layer and a second interconnection layer and the second region is arranged in a second dielectric layer arranged above the second interconnection layer.

14. The memory device according to claim 13, further comprising a controller configured to selectively couple one of the first MTJ units in the first region in series with one of the second MTJ units in the second region.

15. The memory device according to claim 8, wherein a cross-sectional dimension of the layers of the first MTJ unit and a cross-sectional dimension of the layers of the second MTJ unit are different.

16. The memory device according to claim 15, wherein the cross-sectional dimension of the layers of the first MTJ unit and the cross-sectional dimension of the layers of the second MTJ unit each fall within a range of 30-500 nm.

17. The memory device according to claim 8, wherein the first MTJ unit and the second MTJ unit are connected between a terminal of a select device and a select line (SL), wherein another terminal of the select device is connected to a bit line (BL).

* * * * *